(12) United States Patent
Boutami et al.

(10) Patent No.: US 8,125,043 B2
(45) Date of Patent: Feb. 28, 2012

(54) PHOTODETECTOR ELEMENT

(75) Inventors: Salim Boutami, Grenoble (FR); Roch Espiau De Lamaestre, Grenoble (FR); Jérôme Le Perchec, Grenoble (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 105 days.

(21) Appl. No.: 12/835,335

(22) Filed: Jul. 13, 2010

(65) Prior Publication Data

US 2011/0018087 A1 Jan. 27, 2011

(30) Foreign Application Priority Data

Jul. 13, 2009 (FR) ..................... 09 54868

(51) Int. Cl.
*H01L 31/102* (2006.01)
(52) U.S. Cl. ................ 257/442; 257/E31.018
(58) Field of Classification Search ............ 257/442, 257/E31.018
See application file for complete search history.

(56) References Cited

U.S. PATENT DOCUMENTS 5,373,182 A * 12/1994 Norton ................... 257/440
6,111,254 A * 8/2000 Eden ...................... 250/338.1
2005/0247993 A1 * 11/2005 Yoneda et al. .......... 257/459
2006/0175551 A1   8/2006 Fan et al.
2007/0104411 A1   5/2007 Ahn et al.

OTHER PUBLICATIONS

"Plasmon-based photosensors comprising a very thin semiconducting region", Le Perchec, J., et al., Applied Physics Letters, AIP, American Instititue of Physics, Melville NY US LNKD—DOI:10.1063/1.3132063, vol. 94, No. 18, May 7, 2009, pp. 181104-181104, XP012121129, ISSN: 0003-6951.
Search Report issued in French Patent Application No. 09/54868 on Apr. 21, 2010.

* cited by examiner

*Primary Examiner* — Trung Q Dang
(74) *Attorney, Agent, or Firm* — Vedder Price PC

(57) ABSTRACT

An element of photodetection of a radiation having a wavelength in vacuum close to a value $\lambda_0$, including:
- a semiconductor layer of index ns and of a thickness ranging between $\lambda_0/4$ ns and $\lambda_0/20$ ns;
- on one side of the semiconductor layer, a first medium of index n1 smaller than ns, transparent to said wavelength;
- on the other side of the semiconductor layer:
  - a region of a second medium of index n2 smaller than ns, having a width L substantially equal to $\lambda_0$/ns and,
  - on either side of said region, a third medium, of index n3 greater than index n2, forming a reflective interface with the second medium.

10 Claims, 2 Drawing Sheets

PHOTODETECTOR ELEMENT

BACKGROUND OF THE INVENTION

1. Field of the Invention

The present invention relates to a photodetector. The present invention more specifically relates to a photodetector comprising a semiconductor layer having a thickness smaller than the wavelength of the light to be detected.

2. Discussion of the Related Art

Current photodetectors generally comprise a semiconductor layer associated with a charge transfer device. When a light beam illuminates the semiconductor layer, the incident photons form electron-hole pairs therein. The carriers are then transferred by the charge transfer device to an electronic circuit which enables them to be quantified.

The average depth at which electron-hole pairs are formed in a semiconductor layer depends on the wavelength of the incident light beam and on the semiconductor material used: the greater the wavelength, the deeper the electron-hole pairs are likely to form in a semiconductor layer. For example, to absorb approximately 99% of red light, it is necessary to have a silicon layer with a thickness of approximately 10 µm. For blue light, a silicon layer having a thickness on the order of 3 µm is sufficient to reach such an absorption rate. Such thicknesses are much greater than the wavelengths of the light waves which are desired to be detected and become prohibitive in the case of far infrared or of terahertz waves.

In the case of an image detector, the size of the pixels of elementary photodetectors is generally desired to be decreased. The decrease in the surface area taken up by each pixel on the semiconductor layer especially poses problems of isolation of the photosensitive regions from one another. Indeed, to avoid interferences between neighboring pixels, it is generally provided to form isolating trenches around each of them. If the semiconductor layer is relatively thick, the isolating tranches take up a non-negligible surface area of the semiconductor layer, which is not compatible with the general pixel size decrease. The thickness of the semiconductor layers thus has to be decreased. However, as indicated previously, the forming of very thin active layers does not normally enable to absorb and detect all the incident light.

It has thus been provided to increase the equivalent thickness of the semiconductor photodetector layer by having the photons cross this layer twice or several times. Thus, a mirror may be provided on one side of the semiconductor layer to provide a double travel therein. Reflective elements may also be provided on either side of the semiconductor layer to form structures of Fabry-Pérot type. In practice, the reflective elements are Bragg mirrors which are generally thick, for example formed of a stack of from 10 to 30 quarter-wavelength layers. The advantage of the thickness decrease of the active semiconductor layer is then lost.

To decrease the thickness of the semiconductor photodetector layers, it has been provided to take advantage of physical phenomena of collective electron charge oscillation (plasmon resonance). However, the use of the plasmon resonance generally implies the provision of periodic structures, which makes the detector very selective in terms of wavelength and of angle of incidence. Further, structures using the plasmon resonance must be sized in highly accurate fashion, which makes the manufacturing difficult.

SUMMARY OF THE INVENTION

Further, it is desirable to be able to form photodetectors in which the semiconductor material can be selected from a wide range of semiconductor compounds, some of which can only be deposited in an extremely thin layer.

An object of the present invention is to provide a photodetector comprising a very thin semiconductor layer and having at least one of the following features:
  it must be little selective in terms of frequency;
  it must not or only slightly be reflective in the response interval;
  it must be little sensitive to the angle of incidence of the incident light beam;
  it must be little sensitive to the biasing of the incident light beam;
  it must be capable of selecting one of the two fundamental polarizations; and
  it must have dimensions smaller than the wavelength of a light beam to be detected.

Thus, an embodiment of the present invention provides an element of photodetection of a radiation having a wavelength in vacuum close to a value $\lambda_0$, comprising a semiconductor layer of index ns and of a thickness ranging between $\lambda_0/4$ ns and $\lambda_0/20$ ns; on one side of the semiconductor layer, a first medium of index n1 smaller than ns, transparent to said wavelength; and, on the other side of the semiconductor layer, a region of a second medium of index n2 smaller than ns, having a width L substantially equal to $\lambda_0$/ns and, on either side of said region, a third medium, of index n3 greater than index n2, forming a reflective interface with the second medium.

According to an embodiment of the present invention, the semiconductor layer has a thickness ranging between $\lambda_0/4$ ns and $\lambda_0/10$ ns.

According to an embodiment of the present invention, the second medium is identical to the first medium.

According to an embodiment of the present invention, the second medium has an index greater than the index of the first medium.

According to an embodiment of the present invention, the third medium is metallic.

According to an embodiment of the present invention, the third medium has a thickness greater than $\lambda_0/10$.

According to an embodiment of the present invention, an HgCdTe semiconductor layer is formed on a CdTe substrate, the second medium also being CdTe and the third medium being gold.

The present invention also provides an assembly of photodetector elements such as hereabove, connected in parallel to form a photodetector of large dimension.

According to an embodiment of the present invention, the assembly comprises photodetector elements such as hereabove, connected separately to form a pixel array.

According to an embodiment of the present invention, the assembly comprises photodetector elements such as hereabove, capable of operating at identical or different wavelengths.

The foregoing objects, features, and advantages of the present invention will be discussed in detail in the following non-limiting description of specific embodiments in connection with the accompanying drawings.

DETAILED DESCRIPTION

As usual in the representation of micro/nanometric components, the various drawings are not to scale.

In the present description, the wavelength in vacuum of a radiation to be detected will be designated as $\lambda_0$ and the wavelength of this radiation in a considered medium will be designated as $\lambda$. Generally, wavelength $\lambda$, in a medium will be equal to $\lambda_0/n_e$, $n_e$ being the effective index in the region corresponding to the considered medium. It should be noted that, in structures having dimensions smaller than the wavelength, this effective index is generally not strictly equal to the index of the medium, but takes into account the indexes of the neighboring mediums.

Figure 1:
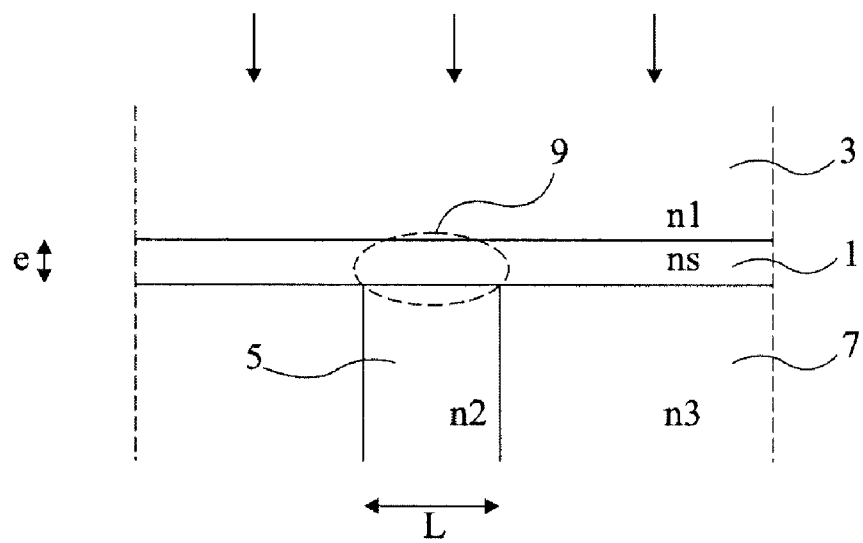
FIG. 1 is a very simplified cross-section view intended to illustrate the principle of a photodetector according to an embodiment of the present invention.

As shown in FIG. 1, the photodetector described herein comprises a thin layer 1 of a semiconductor material of index ns, having a thickness e much smaller than the wavelength, for example, ranging between $\lambda/4$ and $\lambda/10$, preferably close to $\lambda/4$. On one side of layer 1, on the top side in the drawing, is a transparent medium 3 of index n1. On the other side of layer 1 is a region 5 of index n2, having a width L substantially equal to the effective wavelength $\lambda$, in layer 1 of index ns. Region 5 is surrounded with a region 7 of a material selected so that the interface between regions 5 and 7 is strongly reflective, for example, a metal, but also, possibly, a dielectric or semiconductor material of high index.

The materials of the various layers and regions are such that indexes n1 and n2 are smaller than index ns, and that preferably, n2 is greater than n1. In such conditions, the light appears to be essentially trapped in area 9 surrounded with dotted lines in FIG. 1. The trapping of the light may be imputed to a double Fabry-Pérot type effect. First, the light is trapped in thin semiconductor layer 1 due to the fact that this layer has a greater index than the neighboring mediums of indexes n1 and n2 located on either side thereof. Further, in region 5 of width 2, between the two reflectors 7, there is a real Fabry-Pérot effect, the interface between layers 5 and 7 being strongly reflective. The action of this Fabry-Pérot effect is enhanced if index n2 of region 5 is greater than index n1 of medium 3, the light then tending to preferably go towards region 5 rather than towards medium 3. Generally, the present inventors have shown that the height of the interface between regions 5 and 7 must be at least equal to $\lambda_0/10$.

This structure has the advantage of providing features which are relatively independent from the incidence of light in a range of angles of incidence of ±30°, or even ±70° with respect to the direction perpendicular to the detector plane for some material assemblies.

Figure 2:
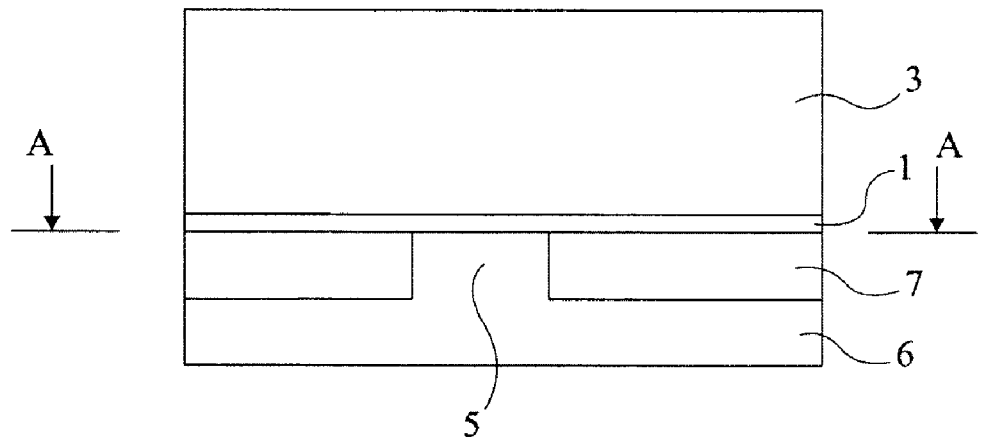
FIG. 2 is a cross-section view of an embodiment of a photodetector according to an embodiment of the present invention.

FIG. 2 shows a practical embodiment of the device of FIG. 1 in the specific case of a detector in the infrared range close to a 4-µm wavelength, the thin semiconductor layer being an HgCdTe layer.

It is started from a CdTe substrate 3 and the following successive steps are carried out:

forming of a thin HgCdTe layer 1 by epitaxy on the substrate;

deposition on layer 1 of a layer 7, for example, a gold layer;
forming of one or several openings in layer 7; and
deposition of a CdTe layer 6 having its portions located in the openings in layer 7 corresponding to regions 5 of FIG. 1.

Within the framework of this example, it can be acknowledged that the absorption of a wave having a wavelength close to 4 µm is at least 5 times greater than for a same HgCdTe layer between two CdTe layers having no openings.

This example has been given to show that the structure according to the present invention is relatively simple to manufacture with current technologies. Many alternative embodiments may however be provided. For example, it is possible to start from layer 6 as a substrate and to grow the other layers on this substrate. Semiconductor layer 1 is then formed at least above region 5.

Referring back to FIG. 1, the incident light from the top coming from medium 3 towards layer 6 concentrates in area 9 and creates electron/hole pairs therein, which must then be measured to obtain the photodetector function. Many methods may be used to collect these charges. It will be seen hereafter that the material of layer 7 may be used for this purpose when it is a metal. To collect the electrons and/or the holes, structures of lateral diode type may also be formed and/or thin conductive layers may be deposited in addition to the shown layers.

As discussed previously, the operation of the device described herein forms an individual point photodetector and its operation is not based on an array structure. An assembly of a plurality of electrically interconnected or separated photodetectors may however be formed to obtain a detection over a greater surface area or over an image array. In the case where the photodetectors are interconnected and are identical, a signal is collected on a greater surface area of the surface of each photodetector taken separately. If the photodetectors are different, the spectral range of the resulting photodetector is widened. In the case where an assembly of separately-read photo-detectors is formed, a spatial image of the absorption or an image discriminated in terms of wavelength is obtained. Different lengths L of regions 5 may be used for different photodetectors, for example, three different widths for a three-color image, since this width L (equal to $\lambda_0/ns$) determines the central frequency of the photodetector.

Figure 3:
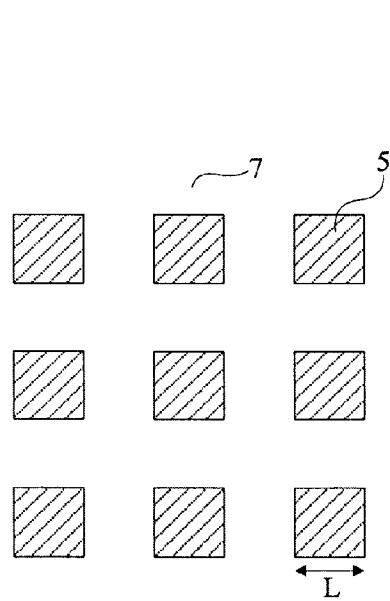
FIGS. 3, 4, and 5 are top views along cross-sectional plane A-A of FIG. 2 of photodetectors according to various embodiments of the present invention.
Figure 4:
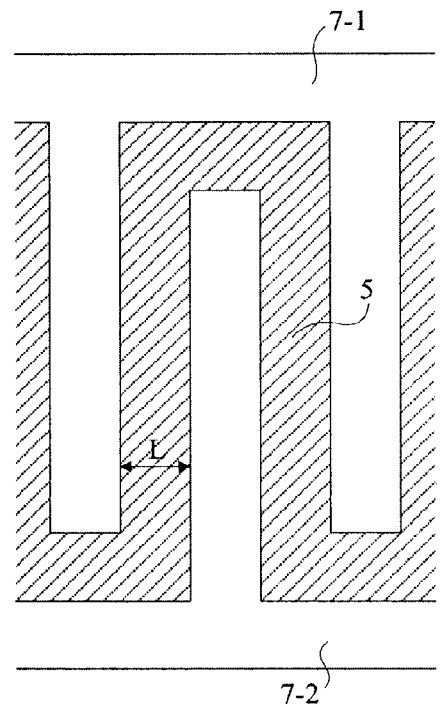
Figure 5:
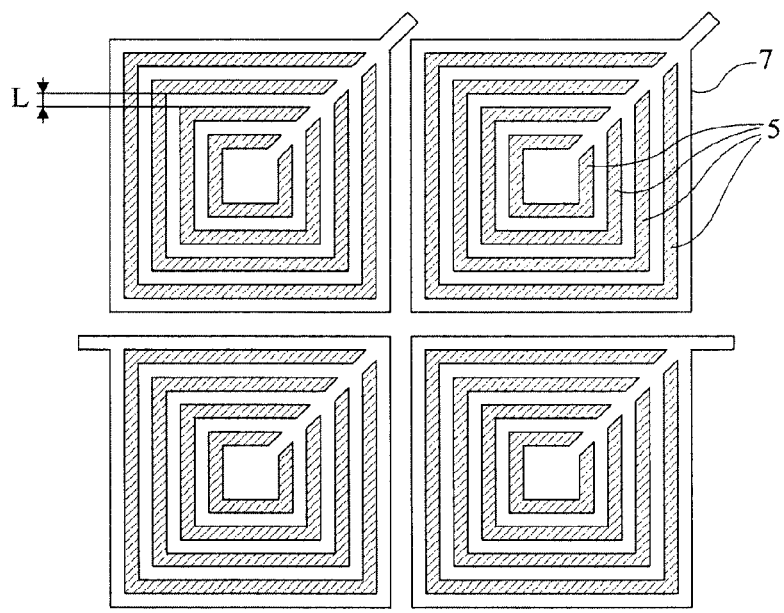

FIGS. 3, 4, and 5 are top views in cross-sectional plane A-A of FIG. 2 showing various possible forms of assembly of regions 5. Windows 5 formed in a conductive plane 7 can be seen in these drawings.

In the case of FIG. 3, the windows, of dimensions L, are square-shaped. They may have any other desired shape. Cross shapes with arms having widths $\lambda$ allowing an easier spectrum sizing may for example be envisaged.

In the embodiment of FIG. 4, the windows have the shape of strips and, thus, electrodes 7-1 and 7-2 may be comb-shaped to read the charges which have built up in the photodetector at the location of windows 5.

FIGS. 3, 4, and 5 are examples only of possible shapes. Many other topologies may be used. Regions having a trapezoidal cross-section or combinations of curved shapes may for example be provided.

More complex shapes such as that shown as an example in FIG. 5 incorporated herein by reference may also be adopted. In the case of this drawing, the dimensions of at least two of the four elements may be different to detect at least two wavelengths.

Of course, the present invention is likely to have many other variations. For example instead of a simple semiconductor layer, interface layers may be provided between semiconductor 1 and the adjacent mediums. A successive deposition of doped regions may also be provided to obtain a diode structure. The forming of a lateral diode may also be provided to allow specific types of detections.

According to the material used, the resonant structure may apply to the visible or infrared (near, mid-, or far infrared) range, or even to the terahertz wave range.

As to regions 7, highly reflective metallic materials, as little absorbing as possible, may be used in the operating range, that is, essentially noble metals (gold, silver, aluminum, as well as alloys with similar optical properties) in the infrared and visible ranges, ionic crystals (such as SiC) and heavily-doped semiconductors in the infrared range, and two-dimensional electron gases in the terahertz range. Dielectric and semiconductor materials of high index may also be used, for example, silicon for a detector in the near infrared range or silicon nitride in the visible range.

As to the semiconductor of layer 1, a semiconductor adapted to the wavelength which is desired to be measured will be selected. It may be silicon (crystal, polycrystal, or amorphous) or GaAs for the visible range; Ge, InSb, GaSb, InGaAs, or HgCdTe for the infrared range.

As described previously, in the case where the forming of the photodetector starts with substrate 3, the substrate layer is made of a transparent material allowing a growth of one or the other of these semiconductors. The following substrate/absorbing layer couples can thus be provided: Ge/Si, SiGe/Si, GaAs/Si, InSb/GaAs, GaSb/GaAs, InGaAs/InP, CdTe/HgCdTe.

If transparent electrode layers must be provided, ITO layers may be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An element of photodetection of a radiation having a wavelength in vacuum close to a value $\lambda_0$, comprising:
   a semiconductor layer (1) of index ns and of a thickness ranging between $\lambda_0/4$ ns and $\lambda_0/20$ ns;
   on one side of the semiconductor layer, a first medium (3) of index n1 smaller than ns, transparent to said wavelength;
   on the other side of the semiconductor layer:
   a region (5) of a second medium (6) of index n2 smaller than ns, having a width L substantially equal to $\lambda_0$/ns, and
   on either side of said region, a third medium (7), of index n3 greater than index n2, forming a reflective interface with the second medium.

2. The photodetector element of claim 1, wherein the semiconductor layer (1) has a thickness ranging between $\lambda_0/4$ ns and $\lambda_0/10$ ns.

3. The photodetector element of claim 1, wherein the second medium (6) is identical to the first medium (3).

4. The photodetector element of claim 1, wherein the second medium (6) has an index greater than the index of the first medium (3).

5. The photodetector element of claim 1, wherein the third medium (7) is metallic.

6. The photodetector element of claim 5, wherein the third medium (7) has a thickness greater than $\lambda_0/10$.

7. The photodetector element of claim 1, wherein an HgCdTe semiconductor layer is formed on a CdTe substrate, the second medium also being CdTe and the third medium being gold.

8. An assembly of photodetector elements of claim 1, connected in parallel to form a photodetector of large dimension.

9. The assembly of photodetector elements of claim 1, connected separately to form a pixel array.

10. The assembly of photodetector elements of any of the foregoing claims, comprising photodetector elements, capable of operating at identical or different wavelengths.

* * * * *